United States Patent [19]

Kintz et al.

[11] Patent Number: 5,030,539

[45] Date of Patent: Jul. 9, 1991

[54] DEVELOPER SHEET USEFUL IN PROVIDING TRANSPARENCIES OR REPRODUCTIONS HAVING A CONTROLLED GLOSS FINISH UTILIZING A SURFACTANT

[75] Inventors: Karl A. Kintz; Robert A. Landis; Kelli J. Borello, all of Kettering, Ohio

[73] Assignee: The Mead Corporation, Dayton, Ohio

[21] Appl. No.: 508,215

[22] Filed: Apr. 11, 1990

Related U.S. Application Data

[63] Continuation-in-part of Ser. No. 368,899, Jun. 13, 1989, abandoned, which is a continuation of Ser. No. 161,629, Feb. 9, 1988, abandoned.

[51] Int. Cl.$^5$ .......................... B41M 5/12; G03C 1/68
[52] U.S. Cl. ..................... 430/138; 430/203; 503/214; 503/215; 503/216; 503/217; 427/147; 427/150; 427/151; 427/152; 427/225; 428/402.2; 428/402.24
[58] Field of Search ................ 430/138, 203; 503/214, 503/215, 216, 217; 427/147, 150, 151, 152, 225; 428/402.2, 402.24

[56] References Cited

U.S. PATENT DOCUMENTS

| | | | |
|---|---|---|---|
| 4,54,235 | 11/1985 | Adair et al. | 430/138 |
| 3,924,027 | 12/1975 | Saito et al. | 427/150 |
| 4,025,490 | 5/1977 | Weaver | 260/53 R |
| 4,226,962 | 10/1980 | Stolfo | 503/225 |
| 4,399,209 | 8/1983 | Sanders et al. | 430/138 |
| 4,418,942 | 12/1983 | Hosoi et al. | 282/275 |
| 4,440,846 | 4/1984 | Sanders et al. | 430/138 |
| 4,772,532 | 9/1988 | Adair et al. | 430/138 |
| 4,775,656 | 10/1988 | Adair et al. | 430/138 |

FOREIGN PATENT DOCUMENTS 2133568 7/1984 United Kingdom ............... 346/221

*Primary Examiner*—Charles L. Bowers, Jr.
*Assistant Examiner*—Patrick A. Doody
*Attorney, Agent, or Firm*—Thompson, Hine and Flory

[57] ABSTRACT

Disclosed is a developer sheet useful in forming reproductions having a glossy finish, or in forming transparencies comprising:

a support having a layer of a finely divided, thermoplastic, developer material on the surface thereof, said developer material being capable of reacting with a color precursor to produce a visible image and being capable of coalescing into a thin film which imparts gloss to said image upon application of heat and/or pressure, and having a surfactant admixed within said layer of developer material to aid in the coalescing of said developer material into a thin film.

17 Claims, No Drawings

DEVELOPER SHEET USEFUL IN PROVIDING TRANSPARENCIES OR REPRODUCTIONS HAVING A CONTROLLED GLOSS FINISH UTILIZING A SURFACTANT

CROSS-REFERENCE TO RELATED APPLICATIONS

This is a continuation-in-part of U.S. application Ser. No. 368,899 filed June 13, 1989, abandoned, which in turn is a continuation of 161,629 filed Feb. 9, 1988 abandoned.

BACKGROUND OF THE INVENTION

1. Field of the Invention

The present invention relates to a developer sheet which is useful in providing visible images through reaction with a color precursor and can provide transparencies or reproductions having a glossy finish. More particularly, the present invention relates to a developer sheet which is capable of providing a controlled degree of gloss ranging from matte to high gloss, and may take the form of a transparency having minimal surface defects.

The developer sheet of the present invention can be used in conjunction with conventional pressure-sensitive copy paper or photosensitive imaging systems employing microcapsules to provide visible images upon contact with a color precursor which is image-wise released from the microcapsules. The imaging system according to the present invention may either be a transfer imaging system or a self-contained imaging system.

2. Description of the Prior Art

Pressure-sensitive copy paper is well known in the art. It is described in U.S. Pat. Nos. 2,550,446; 2,712,507; 2,703,456; 3,016,308; 3,170,809; 3,455,721; 3,466,184; 3,672,935; 3,955,025; and 3,981,523.

Photosensitive imaging systems employing microencapsulated radiation sensitive compositions are the subject of commonly assigned U.S. Pat. Nos. 4,399,209 and 4,416,966 to The Mead Corporation as well as copending U.S. patent application Ser. No. 320,643 filed Jan. 18, 1982. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Image-wise exposure hardens the internal phase of the microcapsules. Following exposure, the imaging sheet is subjected to an uniform rupturing force by passing the sheet through the nip located between a pair of pressure rollers.

U.S. Pat. No. 4,399,209 discloses a transfer system in which the imaging sheet is assembled with a developer sheet prior to being subjected to the rupturing force. Upon passing through the pressure rollers in contact with the developer sheet, the microcapsules rupture and image-wise release the internal phase whereupon the color-former migrates to the developer sheet where it reacts with a dry developer and forms a color image. The imaging system can be designed to reproduce monochromatic or polychromatic full color images.

U.S. Pat. No. 4,440,846 discloses a so called "self-contained" imaging system wherein both the image-forming agent and the developer material are located on the same substrate. In the system according to U.S. Pat. No. 4,440,846, the image-forming agent is encapsulated in a layer of pressure rupturable capsules, and the subsequent exposure and capsule rupture causes the image-forming agent to contact and react with the developer to produce an image on the substrate.

In those applications in which the aforementioned pressure-sensitive and photsensitive imaging systems are used to reproduce graphic or picture images, a high degree of gloss is often desired in the reproduction. In particular, where a transparency is desired, the reproduction must transmit light effectively. These objectives are difficult to achieve using conventional approaches. Because the reaction between the developer and the color-former occurs principally at the surface of the developer, finely divided developers such as resin grinds are developers of choice. They provide a large reactive surface area to react with the color-former and provide high optical density. However, these compositions are made of particles which tend to scatter light and make the image appear dull.

A further problem which occurs when producing transparencies is that the transparency suffers from surface defects commonly referred to as "fish eyes". These defects are caused by the developer layer not forming a continuous uniform film onto the transparency substrate. The discontinuities on the transparency surface results in an inferior final product.

Although attempts have been made in the art to correct some of the above described problems, until the present invention, a solution has not been proposed which can easily remedy these defects.

For example, U.S. Pat. No. 4,554,235 discloses a technique for the production of high gloss images. According to this patent, the developer layer is overcoated with a discontinuous layer of a thermoplastic polymeric pigment. After exposure of an imaging sheet containing thereon a color-forming agent to actinic radiation, the imaging sheet is assembled with the developer sheet and subjected to pressure. The color-former is released from the microcapsules, passes through the layer of polymeric pigment, and reacts with the developer. Thereafter, the thermoplastic pigment is subjected to heat and/or pressure which causes the pigment to coalesce into a transparent continuous thin film which imparts a glossy finish to the image.

An alternative approach in producing high gloss images is disclosed in U.S. patent application Ser. No. 073,036, filed July 14, 1987. According to the teachings of this application, the developer materials utilized are film forming, thermoplastic resins. The resins are provided on a support as finely divided particles. The developer sheet is used in a conventional manner except that, after or simultaneously with development, the developer particles are subjected to heat and/or pressure to cause them to coalesce into a film. According to the teachings of this application, preferred resins of use are phenolic resins.

While the developer materials described in U.S. patent application Ser. No. 073,036 are satisfactory the temperatures desired to effect coalescense of the resins limit the number of resins which may be used and, as such, lower coalescence conditions would be desirable. Furthermore, some of these resins will not uniformly coat synthetic substrates. Further, when producing a transparency according to this invention, the resultant product still suffers from discontinuities accumulated on the surface of the transparency.

Accordingly, there exists a need in the art for a developer sheet which may be utilized to produce a controlled degree of glossing (transparentizing when the substrate is a transparent film) ranging from matte to high gloss while minimizing surface defects. There further exists a need in the art for a developer sheet which utilizes a developer material which coalesces into a continuous thin film wherein the coalescing process takes place at reduced temperatures or for shorter glossing periods.

BRIEF SUMMARY OF THE INVENTION

For purposes of this invention, the term "gloss" when used in connection with transparent substrates is defined to include the concept of the substrate being able to allow light to pass through its front and back surfaces.

In accordance with the present invention, a glossy finish is obtained by using a developer sheet having a layer of finely divided thermoplastic developer material. The layer of finely divided thermoplastic developer material also includes one or more surfactants which, in combination with the thermoplastic developer material, forms a continuous film at low temperatures while minimizing surface defects.

It had been discovered that certain thermoplastic resins and other developer materials were capable of both reacting with a color precursor to produce a visible image and coalescing into a continuous film. The produced film was essentially transparent. It imparted a gloss finish when the image was formed on an opaque background and transmitted light efficiently when the image was formed on a transparent background. Such resins are disclosed in U.S. patent application Ser. No. 073,036. In accordance with the present invention, by incorporating into the developer layer a specific surfactant, the continuous film may be more easily coalesced (i.e. at lower temperatures or shorter glossing times). Further, the degree of gloss can be adjusted by controlling the coalescence conditions (e.g. heat treatment). By doing this, finishes ranging from matte to high gloss can be provided. When producing a transparency, a completely continuous transparent film is produced having a minimal number of surface defects.

In accordance with one embodiment of the present invention, the developer materials are film forming-thermoplastic, phenolic resins (e.g. phenol-formaldehyde resins) and the surfactant(s) used in combination with the phenolic resins may either be a terphenyl or a dialkyl ester of a sulfo-dicarboxylic acid. The developer materials, including the surfactant, are provided on a support as finely divided particles which usually range from 0.1 to 25 microns in particle size. The developer sheet is used in a conventional manner except that, after or simultaneous with development, the developer particles are subjected to heat and/or pressure which cause them to coalesce into a thin continuous film.

Thus, one embodiment of the present invention provides a developer sheet comprising a support having a layer of finely divided, thermoplastic, developer material on the surface thereof, the developer material being capable of reacting with a color precursor to produce a visible image and being capable of coalescing into a thin film which imparts gloss to the image upon the application of heat and/or pressure, and having a surfactant admixed within the layer of developer material to aid in the coalescing of the developer material into a thin film.

The developer sheet may be used in combination with an imaging sheet in a transfer imaging system, or may be used as part of a self-contained imaging system.

Another embodiment of the present invention is a process for forming images comprising the steps of image-wise reacting a color precursor with a reactive surface of a developer sheet comprising a support having a layer of finely divided, thermoplastic, developer material on the surface thereof to produce an image, the developer material being capable of coalescing into a thin film which imparts gloss to the image upon the application of heat and/or pressure, a surfactant being admixed within the layer of developer material; and coalescing the developer material by applying heat and/or pressure to the developer material, the surfactant aiding in the coalescence of the developer material to thereby form a continuous thin film.

Accordingly, it is an object of the present invention to provide a developer sheet capable of imparting gloss to an image by utilizing a developer resin in combination with a surfactant to produce a continuous thin film.

It is a further object of the present invention to produce glossy images utilizing lower gloss temperatures for coalescing or shortening the glossing time for producing a continuous thin film.

A further object of the present invention is to provide a developer sheet useful as a transparency which, upon coalescing, does not contain coating defects because of the low surface tension of the layer of developer material utilized.

It is yet a further object of the present invention to provide a developer sheet capable of imparting gloss to a produced image wherein the developer material has incorporated therein one or more specific surfactants to aid in coalescing the developer material into a thin film.

It is an additional object of the present invention to provide a developer sheet capable of producing glossy images in a transfer coating system.

A further object of the present invention is to provide a developer sheet wherein the developer resins may easily be coated onto the base substrate.

It is yet another object of the present invention to provide a developer sheet capable of providing high gloss images which functions as a self-contained imaging sheet.

Another object of the present invention is to provide a process for forming images having a glossy finish by reacting a color precursor with a reactive surface of a developer sheet wherein the developer sheet contains a developer material capable of coalescing into a thin film, and wherein the developer material has contained therein one or more surfactants to aid in the coalescing of the developer material.

These, and other objects, will be readily recognized and understood by one skilled in the art as reference is made to the following detailed description of the preferred embodiments.

DETAILED DESCRIPTION OF THE PREFERRED EMBODIMENTS

While describing the preferred embodiments, specific terminology will be utilized for the sake of clarity. It is to be understood that such terminology includes not only the recited embodiments, but all technical equivalents which perform substantially the same function in substantially the same way to obtain the same result.

A developer sheet in accordance with the present invention includes a support which is overcoated with a layer of a coalescable finely divided thermoplastic developer material having contained therein one or more surfactants. The layer may consist only of developer material and surfactant, or may be an admixture of such materials with a binder which adheres the developer material and surfactant to the support. Preferably, the developer material adheres to the support without a binder. The support may be paper or a transparent film such as polyethylene terephthalate.

Alternatively, the configuration can take the form of a self-contained sheet. The sheet would comprise a support having coated thereon a layer of coalescable developer resin containing a surfactant therein. Deposited directly onto the coalescable resin or admixed therewith is a layer of microcapsules which are filled with an internal phase containing a chromogenic material and a photosensitive composition.

The developer materials used in the present invention are finely divided thermoplastics having a surfactant incorporated therein. Their softening points typically range from about 100° to 200° C., but those skilled in the art will appreciate that materials with higher and lower softening points may also be useful. The particle size is preferably in the range of about 0.5 to 25 microns. The addition of the surfactant acts to lower the glossing temperature for the developer and assists in coating the developer resin onto the substrate.

A typical example of a thermoplastic developer material useful in the present invention is a phenolic resin. Phenolic resins have been conventionally used as developer materials in pressure-sensitive recording materials. These resins may be the condensation product of phenols (including substituted phenols) and formaldehyde. The resins may be further modified to include amounts of unsubstituted or substituted salicylic acids in a manner known in the art. Examples of phenolic resins useful in the present invention are described in U.S. Pat. Nos. 3,455,721; 3,466,184; 3,672,935; 4,025,490; and 4,226,962.

Another class of phenolic resin useful in the present invention is the product of oxidative coupling of substituted or unsubstituted phenols or bisphenols. Oxidative coupling may be catalyzed by various catalysts but a particularly desirable catalyst is the enzyme, horseradish peroxidase. Particularly desirable developers are the resins described in commonly assigned U.S. Pat. No. 4,647,952, which is incorporated herein by reference, and more particularly the product of oxidative coupling of bisphenol A.

The phenolic developers used in the present invention may be metallated to improve their developing characteristics. They may be metallated by reaction with a salt selected from the group consisting of copper, zinc, aluminum, tin, cobalt and nickel. Most typically, the resins are zincated to improve development. The metal content of the resins is generally about 1 to 5% by weight of the resin, but may range up to 15%.

Especially preferred developer materials are phenol-formaldehyde condensation products. More particularly, alkylphenolic resins and, still more particularly, metallated products of alkylphenolic resins are preferred. The alkyl phenols are monosubstituted by an alkyl group which may contain 1 to 12 carbon atoms. Examples of alkyl phenols are ortho- or para- substituted ethylphenol, propylphenol, butylphenol, amylphenol, hexylphenol, heptylphenol, octylphenol, nonylphenol, t-butylphenol, t-octylphenol, etc.

Another class of phenolic thermoplastic developer material which may be practiced within the scope of the present invention is a resin-like condensation product of a polyvalent metal salt, such as a zinc salt, and a phenol, a phenolformaldehyde condensation product, or a phenol-salicylic acidformaldehyde condensation product. This developer material is available from Schenectady Chemical Co. under the designation HRJ 4250 and HRJ 4542. These products are reported to be a metallated condensation product of an ortho- or para-substituted alkylphenol, a substituted salicylic acid, and formaldehyde.

Also useful in the present invention are certain vinyl developer resins and blends of vinyl and phenolic developer resins as described in U.S. Pat. Nos. 4,853,364 and 4,877,761.

Incorporated with the thermoplastic developer material is one or more surfactants. The surfactant(s) is selected to specifically complement the developer material to aid the developer material in coalescing and, particularly in the case of transparencies, to aid in coating without fish eyes and other coating defects. The surfactant(s) is preferably present in an amount of about 0.05 to 5 parts per 100 parts of developer material, more preferably about 0.5 to 1.5 parts per 100 parts.

A preferred class of surfactant is the terphenyls, with m-terphenyl being the most preferred terphenyl.

Another class of surfactant which may be utilized according to the teachings of the present invention are dialkyl esters of sulfo-dicarboxylic acids having 2 to 4 carbon atoms in the acid moiety and 1 to 18 carbon atoms in the ester moieties. Preferred surfactants are the dialkyl esters of sodium sulfosuccinic acid. Of these, a more preferred surfactant is the di-octyl ester of sodium sulfosuccinic acid. This surfactant is commerically available from American Cyanamid.

Other available surfactants and plasticizers may be used in the present invention. For example, crystalline materials having a melting point over 100° C. may be utilized. Examples of such materials are diphenyl phthalate, dimethyl isophthalate, methyl palmitate, triphenyl phosphate, dicyclohexyl phthalate, ortho,para-toluene sulfonamide, methyl stearate, propylene glycol monostearate, zinc stearate and di-2-ethylhexyl phthalate glycols (e.g., polyethylene glycol, polypropylene glycol, ethylene glycol and diethylene glycol).

In addition, several commercially available surfactants may be used in the present invention. Examples of such materials are Zonyl FSK (a fluoro-surfactant), Aerosol MA 80 (a diheptyl ester of sodium sulfosuccinic acid), Silwet L-721 (a silane surfactant), Polytergent SL 2 (an alkoxylated linear alcohol), and Mazer MAFO 13 (an ethoxylated free amine amphoteric surfactant).

To form the developer sheet according to the present invention, the developer resin and the surfactant(s) are admixed and are coated onto the surface of a substrate by using conventional coating techniques. The coating composition may be an aqueous suspension or emulsion. The developer material, including surfactant, is usually applied to the surface of the support in an amount of about 8 to 15 g/m$^2$. Depending upon the nature of the developer material and how it is obtained, a binder may be necessary to adhere the developer resin and surfactant to the support.

The developer layer, including surfactant, may consist of thermoplastic developer material and surfactant, or an admixture of a thermoplastic developer material, surfactant and a thermoplastic latex (e.g., styrene-butadiene copolymer latex), or a binder having a refractive index which closely approximates or is equal to that of the melted thermoplastic developer material (e.g., carboxylic latex).

In addition to a surfactant, it is also advantageous for the developer layer to contain an ultraviolet absorber and/or an optical brightener to prevent yellowing. Examples of such materials are described in U.S. application Ser. No. 184,735 filed Apr. 22, 1988. A preferred absorber is Leucophor L which is commercially available from Sandoz Chemicals, Charlotte, N.C., and which is provided in a glycol base which plasticizes the composition.

It is critical that the developer materials be present on the surface of the developer sheet as finely divided particles or microspheres. Finely divided thermoplastic developer materials useful in the present invention may be obtained by several processes. A developer material can be prepared in a conventional manner and a melt of the material can be atomized. Alternatively, a melt of the developer material can be injected into a rapidly agitated aqueous medium whereupon the melt is solidified as droplets which are recovered. The developer material can also be dissolved in a solvent/non-solvent system and the solvent removed. Other materials such as Schenectady HRJ 4250 and HRJ 4542 resins may be obtained in a dispersed form.

To form a glossy image, the following procedure is undertaken. If the imaging system is a transfer type system, an imaging sheet containing a color precursor is image-wise transferred to the surface of a developer sheet according to the present invention such that the color precursor directly contacts the developer material. A visible image is formed in the areas where the color precursor is released to react with the developer material. The visible image is usually the product of an acid-base reaction between the color precursor, which is usually an electron donor, and the developer, which is usually an electron acceptor. The color precursor may be contained in microcapsules which also have contained therein a photosensitive composition or it may be contained in conventional pressure sensitive microcapsules containing no photosensitive composition. Upon exposure of photosensitive capsules to actinic radiation, the photosensitive composition increases in viscosity to prevent the color-forming agent from being released from the internal phase of the microcapsules. The internal phase of the microcapsules remain liquid in the areas where the microcapsules are not exposed to actinic radiation. When these microcapsules are ruptured and the color-forming agent is transferred to the developer sheet, an image is produced on the developer sheet.

Typically, the photosensitive microcapsules are ruptured by passing the imaging sheet in combination with the developer sheet through a pair of pressure rollers. In addition to pressure, however, a magnetic brush as described in U.S. Pat. No. 4,592,986 or free particles as described in U.S. Pat. No. 4,578,340 may be used. Pressure-sensitive microcapsules are ruptured through the action of pressure.

After developing the image, the developer sheet is subjected to heat and/or pressure to coalesce the developer material into a continuous film. Depending on the processing conditions which are used (more particularly the amount of heat and pressure applied), degrees of gloss ranging from matte to low gloss to high gloss can be obtained.

After exposure, development and coalescence of the developer material, the image can be viewed. If the substrate is opaque, such as a sheet of paper, the image may be viewed from above. On the other hand, if the substrate is transparent, the image may be viewed from either above or below. When the substrate is transparent, it is used as a transparency for overhead projections or the like or it may be laminated to a sheet of plain paper or a similar material providing a white background. In this manner, the paper or similar material provides a white background against which the developed image can be viewed.

Various degrees of controlled glossing can be produced in accordance with the present invention. The degrees of glossing can be controlled by altering the parameters of gloss temperature and pressure as is commonly known in the art.

Where the developer sheet is to be used as a transparency, the support film is transparent (for example, polyethylene terephthalate) and complete coalescence of the developer resin is required.

The addition of the surfactant to the developer material aids in coating and coalescing the developer material and to form a defect free coating. This is particularly important when producing transparencies, as any discontinuities on the developer surface will result in defects in the image produced. The inventors have surprisingly discovered that the addition of the above enumerated surfactants to the developer material enables a more uniform coat of developer resin onto a polyethylene terephthalate base stock. This is caused by lowering of the surface tension of the developer composition as a result of the addition of the surfactant. Accordingly, due to the lowered surface tension, a uniform transparent coating without surface defects is produced.

In addition, the addition of the surfactant to the developer resin enables glossing at lower temperatures or for shorter periods of time. For example, without the addition of a surfactant, the glossing temperature of HRJ-4542 resin (temperature at which the resin transparentizes) ranges between 150° and 170° C., when a 60 second heating time is selected. By adding a surfactant, the glossing temperature is lowered to a range between about 100° C. and 130° C. for a 60 second time period. Conversely, if the substrate containing surfactant were exposed to heating between 150° C. and 170° C., a shorter glossing time would be obtained.

When developing an image in a self-contained imaging system, the microcapsules are present on the same surface as the developer resin including a surfactant, such that the capsules contact the developer resin. Upon rupture of the microcapsules, an image is formed upon reaction of the color-forming agent with the developer material. As is the case with the transfer imaging system, the self-contained sheet is subjected to heat and/or pressure to coalesce the developer material.

The present invention is now described in greater detail by reference to the following Examples and Comparative Examples which are given here for illustrative purposes only and are by no means intended to limit the scope of the present invention.

COMPARATIVE EXAMPLE 1

It was attempted to coat a polyethylene terephthalate substrate on its upper surface, with a developer resin. The developer resin was HRJ-4542. It was very difficult to form a uniform bead to coat the substrate as the developer resin had a high surface tension.

EXAMPLE 1

The experiment of Comparative Example 1 was repeated with the exception that 0.4 parts of di-octyl ester of sodium sulfosuccinic acid were added to 99.6 parts of the developer resin prior to coating onto the polyethylene terephthalate substrate. The developer resin and surfactant uniformly coated the substrate as the coating material had a lowered surface tension. Without adding the surfactant, it would be impossible to manufacture overhead projection transparencies.

COMPARATIVE EXAMPLE 2

A polyester substrate was coated with the developer resin supplied by Schenectady Chemical as HRJ-4542. The substrate was run through a pressure nip and heated in a 90° C. oven for 60 seconds. The total transmission value (a measure of the ability of light to pass through a substrate without considering scattering effects, a value of 100 indicates complete transparency of a substrate) was 92.25, and the regular transmission value (a measure of the ability of light to pass through a substrate considering scattering effects) was 69.28 resulting in a percent of haze (100×(total transmission - regular transmission)/total transmission) of 24.90.

EXAMPLE 2

About 10% of total solids of m-terphenyl was added to the resin supplied by Schenectady Chemical as HRJ-4542. This was done by heating separately the resin and the m-terphenyl to 90° C. A Servodyne mixer was operated at 1,000 revolutions per minute and the terphenyl was added to the resin dispersion. After mixing for five minutes at 90° C., the heat was turned off. After an additional five minutes, the stirring rate was reduced to 350 revolutions per minute. Once the dispersion temperature had lowered to 45° C., the dispersion was bottled and allowed to sit overnight. The dispersion containing the terphenyl was coated on polyester base stock. The polyester sample was then run through a pressure nip and heated in a 90° C. oven for 60 seconds. The total transmission value was 92.79, and the regular transmission value was 78.05 resulting in a percent of haze of 15.88. This results in a corresponding reduction of haze of approximately 36.22% as compared to Comparative Example 2.

EXAMPLE 3

The following developer compositions were prepared containing a phenolic developer resin, HRJ-4542, commercially available from Schenectady Chemical, Aerosol OT-75 surfactant, polyethylene glycol (PEG), and de-ionized water. Each composition was diluted to 35% solids with water. The compositions were drawn down on PET, developed by contact with an exposed sheet carrying photosensitive microcapsules containing a color former, and glossed in an oven at 130° C. for 1 minutes. Haze was measured as percent light scatter. Higher numbers reflect more haze.

| Sample | PEG (MW) | Resin (%) | OT-75 (%) | Dmax | Haze |
|---|---|---|---|---|---|
| A | — | — | — | .65 | 16.2 |
| B | 4600 | 99 | 1 | .42 | 6.5 |
| C | 4600 | 94 | 1 | .63 | 8.5 |
| D | 8000 | 98 | 1 | .43 | 6.7 |
| E | 8000 | 98 | 1 | .61 | 9.08 |

In the preferred embodiment, the color-forming agent is contained in microcapsules which also contain a photopolymerizable substance therein. However, the present invention is not limited to microcapsules containing photohardenable substances. Rather, the developer sheet may be used with any type of microcapsule which exudes a color-forming agent which reacts with the inventive developer sheet, e.g., carbonless paper and heat sensitive materials.

Having described the invention in detail and by reference to preferred embodiments thereof, it will be apparent that modifications and variations are possible without departing from the scope of the appended claims.

What is claimed is:

1. A developer sheet useful in forming transparencies comprising:
   a transparent support having a layer of a finely divided, thermoplastic, phenolic resin developer material on the surface thereof, said developer material being capable of reacting with a color precursor to produce a visible image and being capable of coalescing into a thin film which imparts gloss to said image upon application of heat and/or pressure, and having a dialkyl ester of sodium sulfosuccinic acid and a glycol admixed within said layer of developer material to aid in the coalescing of said developer material into a thin film.

2. The developer sheet according to claim 1 wherein said developer material is selected from the group consisting of phenol-formaldehyde resins, a metallated condensation product of a phenol and formaldehyde, and the product of oxidative coupling of a phenol or bisphenol.

3. The developer sheet according to claim 2, wherein said dialkyl ester is di-octyl ester of sodium sulfosuccinic acid.

4. The developer sheet according to claim 3 wherein the gloss temperature of the developer material is about 130° C. when said developer material is heated for about 60 seconds.

5. The developer sheet according to claim 4 wherein said transparent film is polyethylene terephthalate.

6. The developer sheet of claim 5 wherein said glycol is selected from the group consisting of polyethylene glycol, polypropylene glycol, ethylene glycol, and diethylene glycol.

7. The developer sheet of claim 6 wherein said glycol is polyethylene glycol.

8. A system for forming images comprising
   a developer sheet comprising a transparent support having a layer of a finely divided, thermoplastic, phenolic developer material on the surface thereof, said developer material being capable of reacting with a color precursor to produce a visible image and being capable of coalescing into a thin film which imparts gloss to said image upon application of heat and/or pressure, and having a dialkyl ester of sodium sulfosuccinic acid and a glycol admixed within said layer of developer material to aid in the coalescing of said developer material into a thin film; and a donor sheet including a support having a layer of microcapsules on the surface thereof, said microcapsules having a color precursor associated therewith capable of reacting with said developer material to form an image.

9. The system according to claim 8 wherein said microcapsules contain a photohardenable composition associated with said color precursor.

10. A process for forming transparencies comprising the steps of:

image-wise reacting a color precursor with a reactive surface of a developer sheet comprising a transparent support having a layer of finely divided, thermoplastic, phenolic developer material on the surface thereof to produce an image, said developer material being capable of coalescing into a thin film which imparts gloss to said image upon application of heat and/or pressure, said support having a dialkyl ester of sodium sulfosuccinic acid and a glycol admixed within said layer of developer material; and coalescing said developer material by applying heat and/or pressure to said developer material, said surfactant aiding in the coalescing of said developer material.

11. The process according to claim 10 wherein said step of image-wise reacting said color precursor includes the steps of image-wise exposing an imaging sheet including a support having a layer of microcapsules on the surface thereof to actinic radiation, said microcapsules including a photohardenable photosensitive composition as the internal phase and having a chromogenic material associated therewith;

assembling said image-wise exposed imaging sheet with said developer sheet; and subjecting said imaging sheet to a uniform rupturing force such that said microcapsules rupture and release said internal phase in accordance with said image-wise exposure.

12. The process according to claim 10 wherein said developer material is selected from the group consisting of phenol-formaldehyde resins, a metallated condensation product of a phenol and formaldehyde, and the product of oxidative coupling of a phenol or bisphenol.

13. The process according to claim 12 wherein said dialkyl ester is a dialkyl ester of sodium sulfosuccinic acid.

14. The process according to claim 12 wherein said dialkyl ester is di-octyl ester of sodium sulfosuccinic acid.

15. The process according to claim 14 wherein said support is polyethylene terephthalate.

16. The process of claim 15 wherein said glycol is selected from the group consisting of polyethylene glycol, polypropylene glycol, ethylene glycol, and diethylene glycol.

17. The process of claim 16 wherein said glycol is polyethylene glycol.

* * * * *